(12) United States Patent
Hua et al.

(10) Patent No.: US 7,967,913 B2
(45) Date of Patent: Jun. 28, 2011

(54) REMOTE PLASMA CLEAN PROCESS WITH CYCLED HIGH AND LOW PRESSURE CLEAN STEPS

(75) Inventors: Zhong Qiang Hua, Saratoga, CA (US); Sanjay Kamath, Fremont, CA (US); Young S. Lee, San Jose, CA (US); Ellie Y. Yieh, San Jose, CA (US); Hien-Minh Huu Le, San Jose, CA (US); Anjana M. Patel, San Jose, CA (US); Sudhir R. Gondhalekar, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/508,381

(22) Filed: Jul. 23, 2009

(65) Prior Publication Data

US 2010/0095979 A1   Apr. 22, 2010

Related U.S. Application Data

(60) Provisional application No. 61/107,634, filed on Oct. 22, 2008.

(51) Int. Cl.
*B08B 6/00* (2006.01)
(52) U.S. Cl. ............. 134/1.2; 134/1.1; 134/1.3; 134/21; 134/22.1; 134/26; 134/30; 134/31; 134/42
(58) Field of Classification Search .................. 134/1.1, 134/1.2, 1.3, 21, 22.1, 26, 30, 31, 42
See application file for complete search history.

(56) References Cited

U.S. PATENT DOCUMENTS

| 4,138,306 A | 2/1979 | Niwa |
| 4,563,367 A | 1/1986 | Sherman |
| 4,910,042 A | 3/1990 | Hokynar |

(Continued)

FOREIGN PATENT DOCUMENTS

DE    4132559 A1    4/1993

(Continued)

OTHER PUBLICATIONS

Grill, Alfred, "Cold Plasma in Materials Fabrication", IEEE Press, 1994, pp. 109-110, 160-163.

(Continued)

*Primary Examiner* — Sharidan Carrillo
(74) *Attorney, Agent, or Firm* — Kilpatrick Townsend & Stockton LLP

(57) ABSTRACT

A remote plasma process for removing unwanted deposition build-up from one or more interior surfaces of a substrate processing chamber after processing a substrate disposed in the substrate processing chamber. In one embodiment, the substrate is transferred out of the substrate processing chamber and a flow of a fluorine-containing etchant gas is introduced into a remote plasma source where reactive species are formed. A continuous flow of the reactive species from the remote plasmas source to the substrate processing chamber is generated while a cycle of high and low pressure clean steps is repeated. During the high pressure clean step, reactive species are flown into the substrate processing chamber while pressure within the substrate processing chamber is maintained between 4-15 Torr. During the low pressure clean step, reactive species are flown into the substrate processing chamber while reducing the pressure of the substrate processing chamber by at least 50 percent of a high pressure reached in the high pressure clean step.

19 Claims, 6 Drawing Sheets

U.S. PATENT DOCUMENTS

| | | | |
|---|---|---|---|
| 4,913,929 A | | 4/1990 | Moslehi et al. |
| 4,960,488 A | * | 10/1990 | Law et al. ............... 438/694 |
| 4,988,644 A | | 1/1991 | Jucha et al. |
| 5,000,113 A | | 3/1991 | Wang et al. |
| 5,158,644 A | | 10/1992 | Cheung et al. |
| 5,346,579 A | | 9/1994 | Cook et al. |
| 5,350,480 A | | 9/1994 | Gray |
| 5,356,478 A | | 10/1994 | Chen |
| 5,403,434 A | | 4/1995 | Moslehi |
| 5,620,526 A | * | 4/1997 | Watatani et al. ............ 134/1.1 |
| 5,662,770 A | | 9/1997 | Donohoe |
| 5,688,357 A | | 11/1997 | Hanawa |
| 5,770,098 A | | 6/1998 | Araki et al. |
| 5,788,778 A | | 8/1998 | Shang et al. |
| 5,792,272 A | | 8/1998 | van Os et al. |
| 5,812,403 A | | 9/1998 | Fong et al. |
| 5,843,239 A | | 12/1998 | Shrotriya |
| 5,844,195 A | | 12/1998 | Fairbairn et al. |
| 5,939,831 A | | 8/1999 | Fong et al. |
| 5,942,804 A | | 8/1999 | Mohwinkel et al. |
| 6,039,834 A | | 3/2000 | Tanaka et al. |
| 6,055,927 A | | 5/2000 | Shang et al. |
| 6,060,400 A | | 5/2000 | Oehrlein et al. |
| 6,079,426 A | * | 6/2000 | Subrahmanyam et al. .... 134/1.1 |
| 6,109,206 A | | 8/2000 | Maydan et al. |
| 6,125,859 A | | 10/2000 | Kao et al. |
| 6,148,832 A | | 11/2000 | Gilmer et al. |
| 6,170,428 B1 | | 1/2001 | Redeker et al. |
| 6,182,602 B1 | | 2/2001 | Redeker et al. |
| 6,217,951 B1 | | 4/2001 | Mizuno et al. |
| 6,255,222 B1 | | 7/2001 | Xia et al. |
| 6,274,058 B1 | | 8/2001 | Rajagopalan et al. |
| 6,329,297 B1 | | 12/2001 | Balish et al. |
| 6,374,831 B1 | * | 4/2002 | Chandran et al. ............. 134/1.1 |
| 6,379,575 B1 | | 4/2002 | Yin et al. |
| 6,387,207 B1 | | 5/2002 | Janakiraman et al. |
| 6,418,874 B1 | | 7/2002 | Cox et al. |
| 6,435,197 B2 | | 8/2002 | Shin et al. |
| 6,450,117 B1 | | 9/2002 | Murugesh et al. |
| 6,584,987 B1 | | 7/2003 | Cheng et al. |
| 7,159,597 B2 | | 1/2007 | Hua et al. |
| 2002/0020429 A1 | | 2/2002 | Selbrede et al. |
| 2002/0033183 A1 | | 3/2002 | Sun et al. |
| 2003/0029475 A1 | * | 2/2003 | Hua et al. ................... 134/1.1 |
| 2004/0045577 A1 | * | 3/2004 | Ji et al. ....................... 134/1.1 |
| 2005/0258137 A1 | | 11/2005 | Sawin et al. |
| 2006/0266288 A1 | * | 11/2006 | Choi ............................ 118/715 |
| 2007/0248767 A1 | * | 10/2007 | Okura et al. .................. 427/534 |
| 2009/0090382 A1 | * | 4/2009 | Morisada et al. ............. 134/1.1 |
| 2009/0120464 A1 | | 5/2009 | Rasheed et al. |

FOREIGN PATENT DOCUMENTS

| | | |
|---|---|---|
| EP | 0537950 A1 | 4/1993 |
| EP | 0552491 A1 | 7/1993 |
| EP | 0697467 A1 | 2/1996 |
| JP | 1-220434 A | 9/1989 |
| JP | 2-125876 A | 5/1990 |
| KR | 10-1999-0062820 A | 7/1999 |
| WO | WO 97/03223 A1 | 1/1997 |
| WO | WO 99/02754 A1 | 1/1999 |
| WO | WO 99/03312 A1 | 1/1999 |

OTHER PUBLICATIONS

Non-Final Office Action for U.S. Appl. No. 10/153,315; mailed on Dec. 8, 2004; pp. 12.

Final Office Action for U.S. Appl. No. 10/153,315; mailed on Aug. 23, 2005; pp. 9.

Non-Final Office Action for U.S. Appl. No. 10/153,315; mailed on Mar. 21, 2006; pp. 7.

Notice of Allowance for U.S. Appl. No. 10/153,315; mailed on Sep. 26, 2006; pp. 3.

International Search Report for PCT Application No. PCT/US2009/059878 mailed on Apr. 19, 2010; 2 pages.

Written Opinion for PCT Application No. PCT/US2009/059878 mailed on Apr. 19, 2010; 6 pages.

* cited by examiner

REMOTE PLASMA CLEAN PROCESS WITH CYCLED HIGH AND LOW PRESSURE CLEAN STEPS

CROSS-REFERENCES TO RELATED APPLICATIONS

This application claims priority to U.S. Provisional Application No. 61/107,634, filed Oct. 22, 2008. The 61/107,634 application is herein incorporated herein by reference in its entirety.

BACKGROUND OF THE INVENTION

One of the primary steps in the fabrication of modern semiconductor devices is the formation of a layer, such as a silicon oxide layer, on a substrate or wafer. As is well known, such a layer can be deposited by chemical vapor deposition (CVD). In a conventional thermal CVD process, reactive gases are supplied to the substrate surface where heat-induced chemical reactions take place to form the desired film. In a conventional plasma CVD process, a controlled plasma is formed using, for example, radio frequency (RF) energy or microwave energy to decompose and/or energize reactive species in reactant gases to produce the desired film.

Unwanted deposition on areas such as the walls of the processing chamber also occurs during such CVD processes. As is known in the industry, it is common to remove the unwanted deposition material that builds up on the interior of chamber walls with an in situ chamber clean operation. Common chamber cleaning techniques include the use of an etchant gas, such as fluorine, to remove the deposited material from the chamber walls and other areas. In some processes, the etchant gas is introduced into the chamber and a plasma is formed so that the etchant gas reacts with and removes the deposited material from the chamber walls. Such cleaning procedures are commonly performed between deposition steps for every wafer or every n wafers.

Some semiconductor manufactures employ a remote plasma cleaning process as an alternative to an in situ plasma cleaning, a remote plasma cleaning procedure may be employed in which an etchant plasma is generated remote from the substrate processing chamber by a high density plasma source such as a microwave plasma system, toroidal plasma generator or similar device. Dissociated species from the etchant plasma are then transported to the substrate processing chamber where they can react with and etch away the undesired deposition build up. Remote plasma cleaning procedures are sometimes used by manufacturers because they provide a "softer" etch than in situ plasma cleans, i.e., there is less ion bombardment and/or physical damage to chamber components because the plasma is not in contact with chamber components.

BRIEF SUMMARY OF THE INVENTION

Embodiments of the invention pertain to techniques for removing unwanted deposition build-up from one or more interior surfaces of a substrate processing chamber after a substrate is processed in the chamber by, for example, depositing a layer of material over the substrate. One problem with some previously used remote plasma clean processes was that the reactive fluorine species generated in the cleaning process recombined with silicon etched from the interior of the chamber to form silicon tetrafluoride ($SiF_4$) gas phase byproducts that interfere with the efficiency of the clean process Specifically, $SiF_4$ can react in the gas phase with oxygen species generated during the clean process to form $SiO_2$ particles. Embodiments of the invention pertain to a remote plasma clean process in which the $SiF_4$ gas phase byproducts are pumped out by periodically cycling chamber pressure during the clean process between high and low pressure levels.

According to one embodiment after the substrate is transferred out of the substrate processing chamber, a flow of a fluorine-containing etchant gas is introduced into a remote plasma source where reactive species are formed in the remote plasma source. A continuous flow of the reactive species from the remote plasma source to the substrate processing chamber is created while a cycle of high and low pressure clean steps within the substrate processing chamber is repeated. During the high pressure clean step, reactive species are flown into the substrate processing chamber while pressure within the chamber is maintained between 4-15 Torr. During the low pressure clean step, reactive species are flown into the substrate processing chamber while reducing the pressure of the chamber by at least 50 percent of a high pressure reached in the high pressure clean step. Some embodiments repeat the cycle of high and low pressure clean steps at least four times.

In some embodiments chamber pressure during the high pressure step is between 4-15 Torr and chamber pressure during the low pressure step is between 0.5-4 Torr. In some other embodiments chamber pressure in the high pressure step is between 5-8 Torr and between 0.5-2.5 Torr in the low pressure step. In some embodiments the fluorine-containing etchant gas is nitrogen triflouride that introduced into the remote plasma source at a rate of at least 4 liters per minute during the high pressure steps.

In another embodiment, the process of the invention comprises transferring the substrate out of the substrate processing chamber, and thereafter removing the unwanted deposition build-up by: (a) flowing a fluorine-containing etchant gas into a remote plasma source fluidly coupled to the substrate processing chamber, forming reactive species from the etchant gas and transporting the reactive species into the substrate processing chamber; and (b) cycling pressure within the substrate processing chamber between a high pressure within a first range and a low pressure within a second range for at least two cycles of high pressure and low pressure while continuously flowing the fluorine-containing etchant gas into the remote plasma chamber and continuously transporting the reactive species into the substrate processing chamber, where the high pressure is higher than the low pressure.

These and other embodiments of the invention along with many of its advantages and features are described in more detail in conjunction with the text below and attached figures.

DETAILED DESCRIPTION OF THE INVENTION

Embodiments of the invention pertain to techniques for removing unwanted deposition build-up from one or more interior surfaces of a substrate processing chamber after a substrate is processed in the chamber by, for example, depositing a layer of silicon oxide or similar material over the substrate. Fluorine is a commonly used etchant species in remote plasma clean processes and nitrogen trifluoride ($NF_3$) is a common source of fluorine in such processes. During a remote plasma clean in which a fluorine containing as is used as the source of reactive etchant species and a silicon-containing material, such as doped or undoped silicon oxide, silicon nitride or the like, is removed from the interior of the chamber, the reactive fluorine species generated in the cleaning process recombine with silicon etched from the interior of the chamber to form $SiF_4$ gas phase byproducts that interfere with the efficiency of the clean process. $SiF_4$ can react in the gas phase with oxygen species generated during the clean process to form $SiO_2$ particles. Embodiments of the invention minimize the accumulation of $SiF_4$ within the chamber and/or exhaust foreline by periodically cycling chamber pressure during the clean process between high and low pressure levels.

During a standard, uniform pressure remote plasma chamber clean, the partial pressure of $SiF_4$ initially increases over time until it either reaches a peak or a steady state and then declines near the end of the clean as the silicon-containing material is mostly removed. During this clean it is desirable to prevent the $SiF_4$ partial pressure from reaching a sufficient volume that the reaction between fluorine and the silicon-containing material within the chamber reverses to form silicon oxide or other silicon containing particles. In embodiments of the invention, during the low pressure cycles excess $SiF_4$ is pumped out of the chamber and/or foreline thereby reducing the partial pressure of $SiF_4$ and reducing the likelihood of particle formation. While embodiments of the present invention are useful for many different remote plasma clean processes, they are particularly useful in processes in which a high flow rate of a fluorine-containing gas, e.g., a flow rate of 3.0 liters per minute or more, is flowed into a remote plasma generator. Such high flow rate processes generate and transport into the chamber a correspondingly high volume of dissociated reactive species in order to increase the effective clean rate of the chamber as compared to a lower flow rate clean process.

Figure 1:
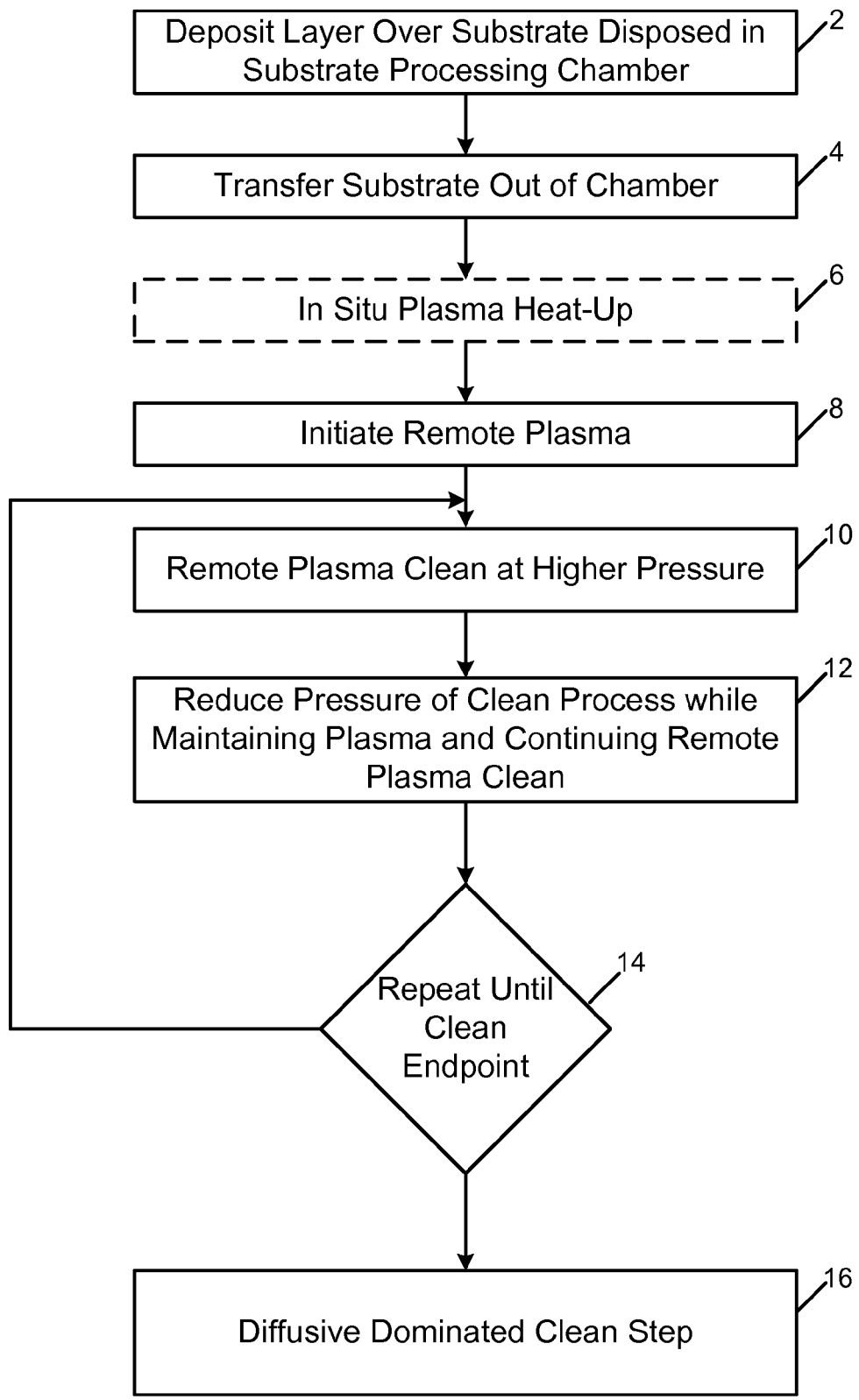
FIG. 1 is a flowchart depicting the steps associated with one embodiment of the present invention.

FIG. 1 is a flow chart depicting the steps according one embodiment of the present invention. As shown in FIG. 1, after a substrate deposition process or other type of substrate processing step (step 2) occurs in a substrate processing chamber, the substrate is transferred out of the chamber (step 4). Next, an optional in situ plasma heating step is carried out (step 6) in which a plasma is formed within the substrate processing chamber from an inert gas such as argon. The plasma heats the substrate processing chamber to a temperature above the temperature of the earlier substrate processing operation (e.g., deposition step) prior to the remote plasma clean process.

Once the chamber is heated to an appropriate temperature, the in situ plasma is extinguished and a plasma is generated in a remote plasma chamber that is fluidly coupled to the substrate processing chamber (step 8). In one embodiment the remote plasma is initiated with an initial flow of argon or similar inert gas before introducing $NF_3$ into the remote plasma chamber. Then, as $NF_3$ is introduced into the remote plasma chamber the flow rate of argon is decreased. As an example, the remote plasma may be initiated with a flow of 3000 sccms of argon which is progressively decreased to 1000 and then to 500 sccm as $NF_3$ is introduced into the remote plasma chamber at an initial flow rate of 1000 sccm and then increased to a flow of 1500 sccm. In one embodiment the remote plasma initiation step uses a cleaning power of between 40-70 percent of the cleaning power used in the primary clean steps. While some unwanted deposition material build-up within the chamber is removed in step 8, the bulk of the clean process occurs during steps 10-16 as discussed below.

Next, the flow rate of $NF_3$ is increased during an initial high pressure remote plasma clean step (step 12). In one embodiment high pressure remote plasma clean step 12 introduces $NF_3$ into the remote plasma chamber at a flow rate of between 8000-14000 sccm and establishes a pressure within the substrate processing chamber between 4-15 Torr. Higher $NF_3$ flow rates and higher chamber pressure generally equate to an increased clean rate but if the chamber pressure is too high, clean uniformity can suffer. Accordingly, some embodiments of the invention establish a chamber pressure of between 5-8 Torr during step 12. In some embodiments pressure is maintained at the desired level through the use of a throttle valve at an appropriate setting. Also, a small argon flow, e.g. 25-60 sccm, can be introduced directly into the chamber through the process gas nozzle bypassing the remote plasma unit to prevent back flow at high pressure.

During high pressure remote plasma clean step 12, $SiF_4$ byproducts from the clean reaction build-up within the chamber and thus the partial pressure of $SiF_4$ increases. Embodiments of the invention reduce the $SiF_4$ partial pressure by reducing chamber pressure to accelerate the removal of gas byproducts from clean step 12 (step 14) by one or both of reducing the flow rate of $NF_3$ and/or fully opening the throttle valve. In some embodiments the $NF_3$ flow rate is dropped to between 20-50 percent of the $NF_3$ flow rate during step 12 and in some embodiments the chamber pressure at the end of step 12 is between 10-50 percent of the high pressure reached during step 10.

Generally it is desirable to reduce the pressure in step 12 as quickly as possible to as low of a pressure level as possible. At reduced chamber pressure levels, clean efficiency temporarily drops. Step 12 can be endpointed on either a time basis or a pressure basis. That is, in some embodiments the reduced pressure clean step 12 is stopped after X seconds while in other embodiments it is stopped once the pressure drops to X Torr. In one embodiment, step 12 is endpointed after a selected period of between 4-8 seconds. In another embodiment, step 12 is endpointed upon reaching a selected pressure between 0.5-4 Torr. In still another embodiment, step 12 is endpointed upon reaching a selected pressure of between 0.5-2.5 Torr. To maintain an overall high clean efficiency, embodiments of the invention minimize the duration of step 12 relative to step 10. In some embodiments, the duration of step 12 is between 10-33 percent of the duration of step 10.

After step 12, the high pressure and low pressure cycles of steps 10 and 12 are repeated one or more times until a desired amount of chamber cleaning occurs (step 14). In some embodiments, steps 10 and 12 are cycled at least four times. In some embodiments, the clean process is completed after step 14. In other embodiments, the flow rate of $NF_3$ is dropped from that of step 10 and chamber pressure is set to a reduced level somewhere between the level of step 10 and the lowest level reached in step 12 to allow for a period of diffusive dominated cleaning (step 16) in order to reduce the amount of clean gas required to effectively clean the chamber as discussed in U.S. Pat. No. 7,159,597, which is hereby incorporated by reference in its entirety. Note that while FIG. 1 shows step 16 occurring after a step 12, in some embodiments the final cycle of step 10 is followed directly by a diffusive dominated clean step 16. For example, in one specific embodiment a clean sequence may be: Steps 2, 4, 6, 8, 10, 12, 10, 12, 10, 12, 10, 12, 10, 16.

Figure 2A:
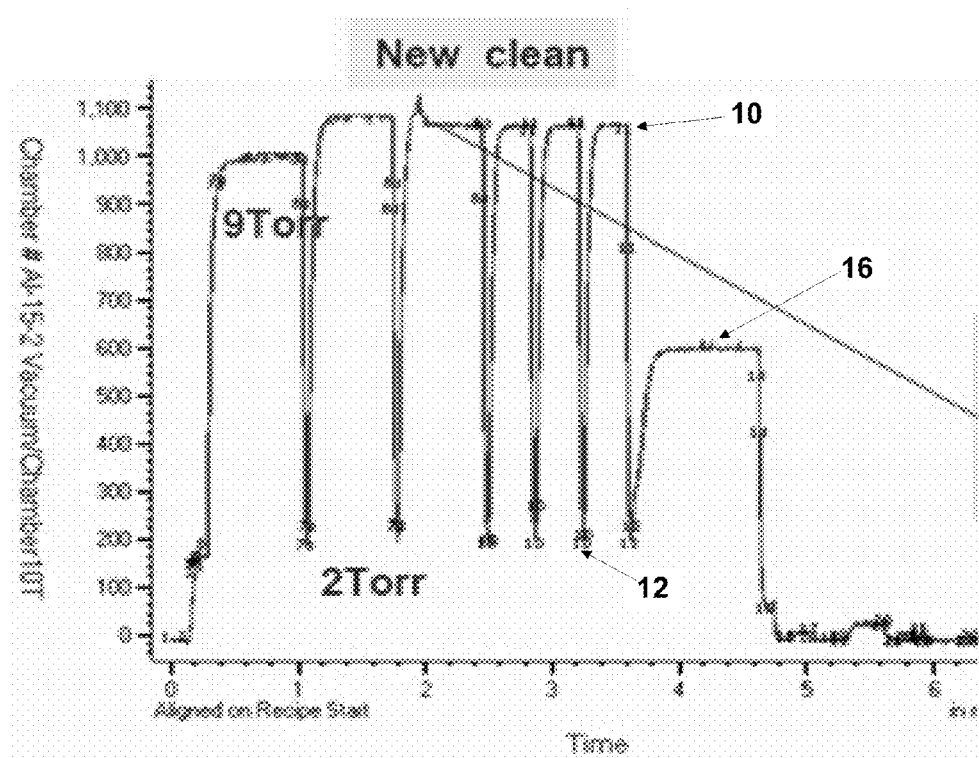
FIG. 2A is a graph illustrating the change in chamber pressure over time according to one specific embodiment of the invention.

FIG. 2A is a graph illustrating the change in chamber pressure over time according to one specific embodiment of the invention where chamber pressure is cycled between approximately 9 Torr and 2 Torr. As shown in FIG. 2A, this particular clean process includes 6 high pressure cycles 10 separated by a corresponding number of low pressure cycles 12. FIG. 2A shows that the duration of each step 12 is considerably shorter than that of each step 10. Near the end of the clean process, chamber pressure is set at a reduced level of approximately 6 Torr for an extended period of time according to clean step 16.

Figure 2B:
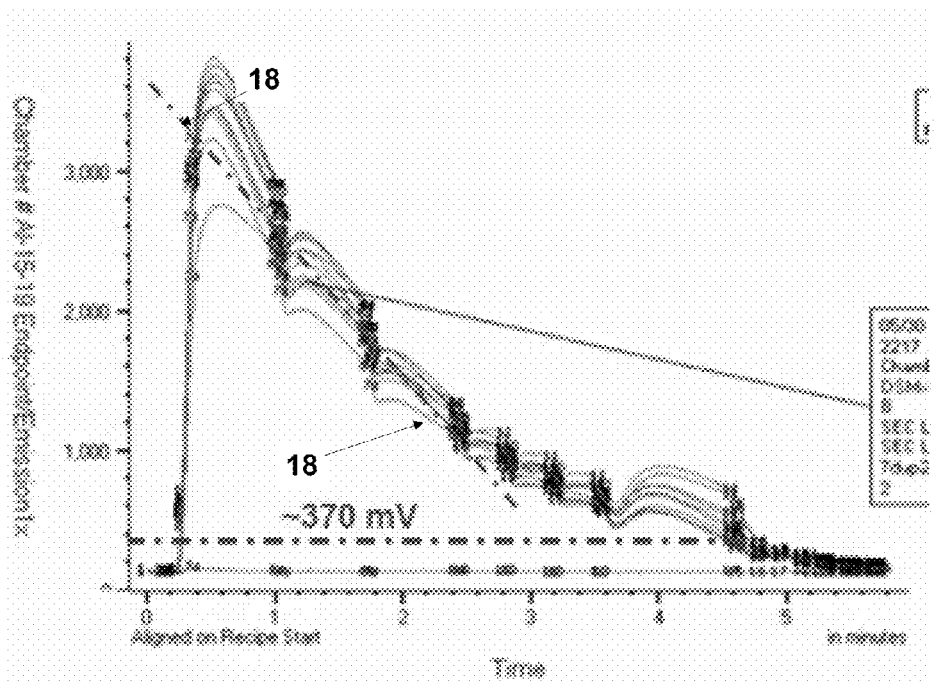
FIG. 2B is a graph depicting the $SiF_4$ emissions over time according to the clean process depicted in FIG. 2A.
Figure 3A:
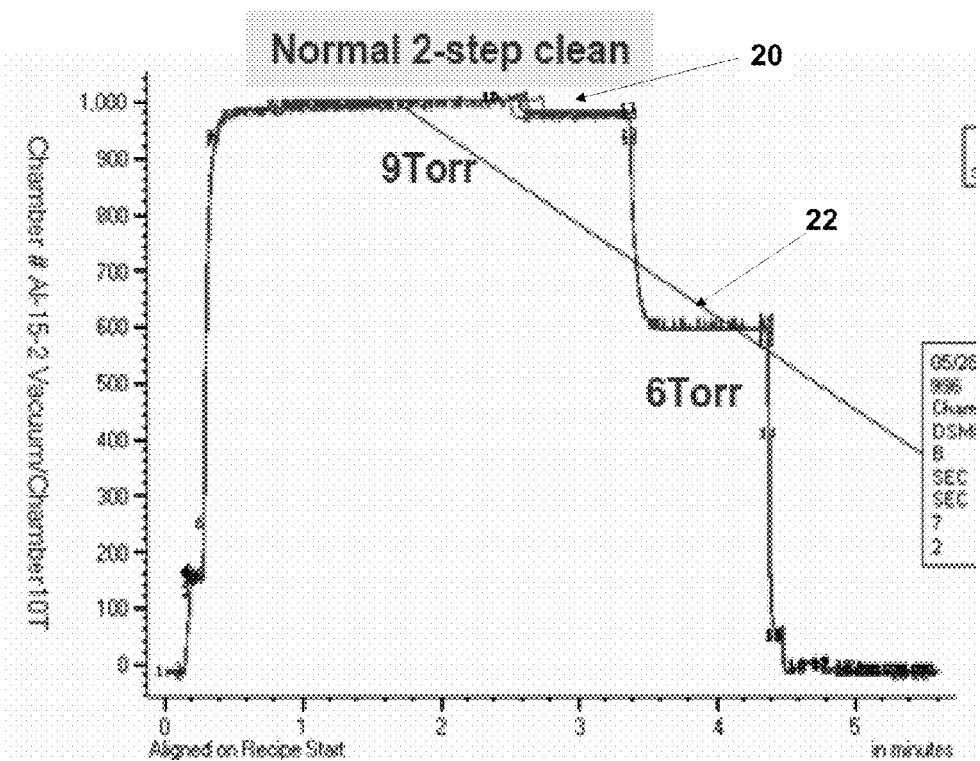
FIG. 3A is a graph illustrating the change in chamber pressure over time according to a previously known clean process.
Figure 3B:
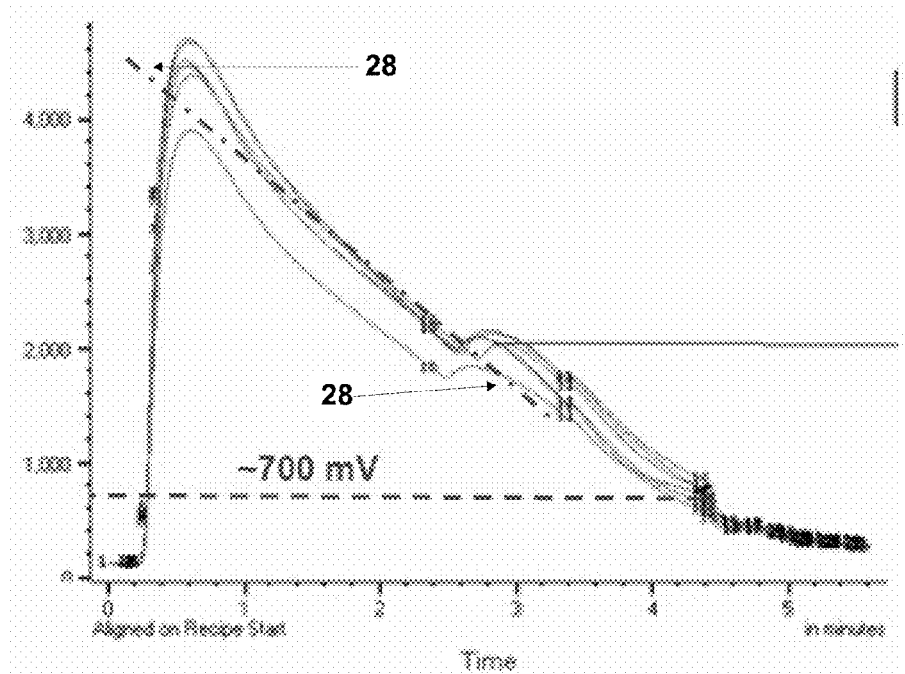
In FIG. 3B is a graph depicting SiFy emissions over time according to the clean process depicted in FIG. 3A.

FIG. 2B is a graph depicting the $SiF_4$ emissions as measured by FTIR techniques known to those of skill in the art that represents how much $SiF_4$ is in the chamber during the process depicted in FIG. 2A. A slope of line 18 indicates the rate at which the chamber is being cleaned during the cycling process of steps 10 and 12. In order to further understand and appreciate the present invention, reference is now made to FIGS. 3A and 3B, which are graphs similar to those of FIGS. 2A and 2B, respectively, representing a previously known clean process in which an initial extended length high level pressure clean step 20 (FIG. 3A) is performed prior to a reduced level clean step 22, which corresponds generally to step 16 in the process shown in FIG. 2A. In FIG. 3B, the slope of line 28 represents the rate at which the chamber is cleaned during step 20.

Figure 4A:
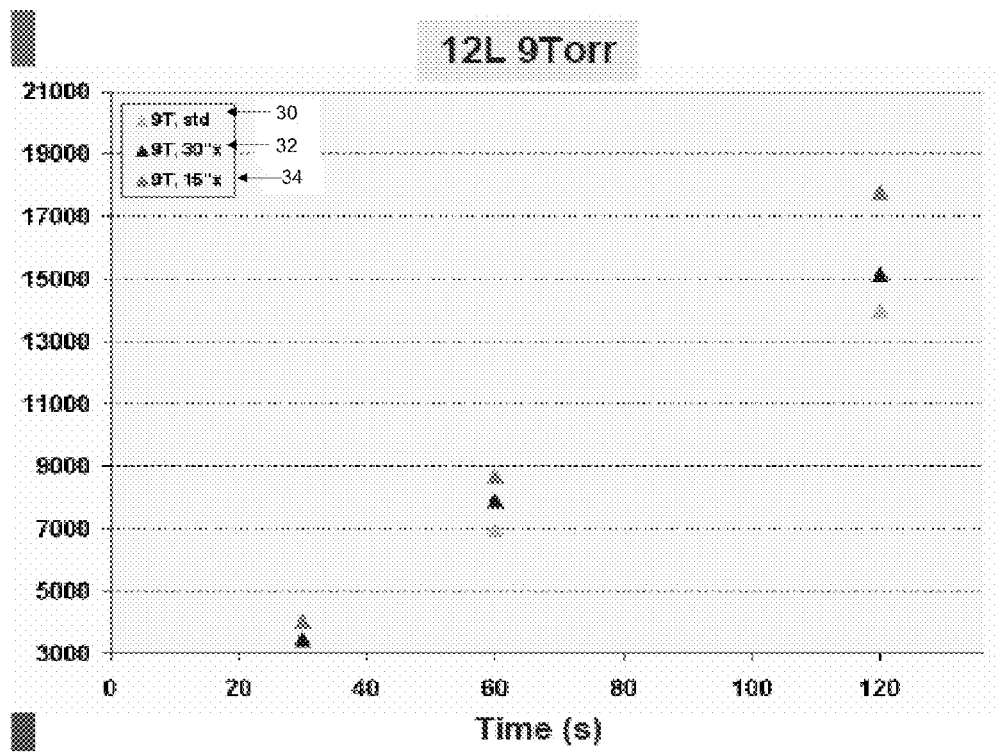
FIGS. 4A and 4B are graphs comparing clean rates over time of clean processes according to embodiments of the invention to previously known clean processes.
Figure 4B:
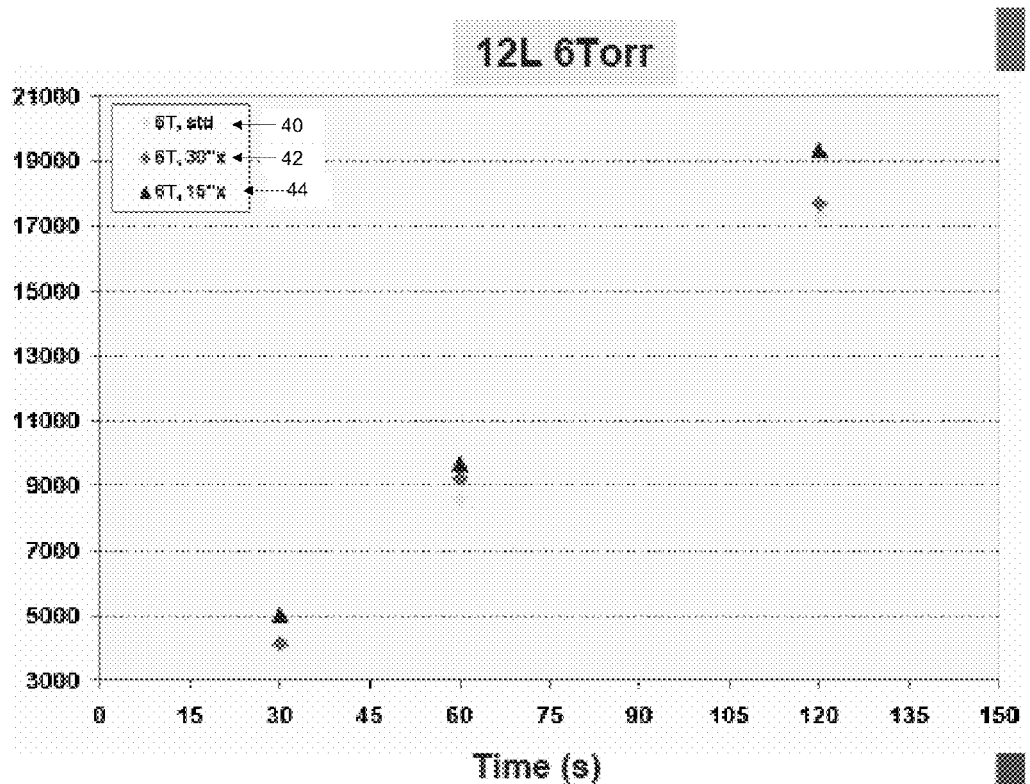

Comparing FIG. 3B to FIG. 2B, the slope of line 18 is greater than that of line 28 which means cycling the chamber pressure from high to low during the remote clean process according to the techniques of the present invention results in a higher clean efficiency than simply keeping the clean pressure at the higher level. FIGS. 4A and 4B provide further evidence of the increased clean efficiency of embodiments of the invention as compared to previously known clean processes. In each of FIGS. 4A and 4B, the clean rate over time is shown for three separate clean processes in which the flow rate of $NF_3$ was set at 12 liters per minute during the high pressure step. The three processes include: a first previously known process similar to that shown in FIG. 3A in which the pressure of step 22 is either 9 Torr (FIG. 4A, process 30) or 6 Torr (FIG. 4B, process 40), a second process similar to that of FIG. 2A in which the pressure of step 10 is either 9 Torr (FIG. 4A, process 32) or 6 Torr (FIG. 4B, process 42) and steps 10 and 12 are cycled every 30 seconds, and in which the pressure of step 10 is either 9 Torr (FIG. 4A, process 34) or 6 Torr (FIG. 4B, process 44) and steps 10 and 12 are cycled every 15 seconds. As evident from comparing the clean rate of processes 32 and 34 to that of process 30 and the clean rate of processes 42 and 44 to that of process 40, in all instances the clean processes performed according to techniques of the present invention had a higher clean efficiency than the previously known clean process.

Figure 5A:
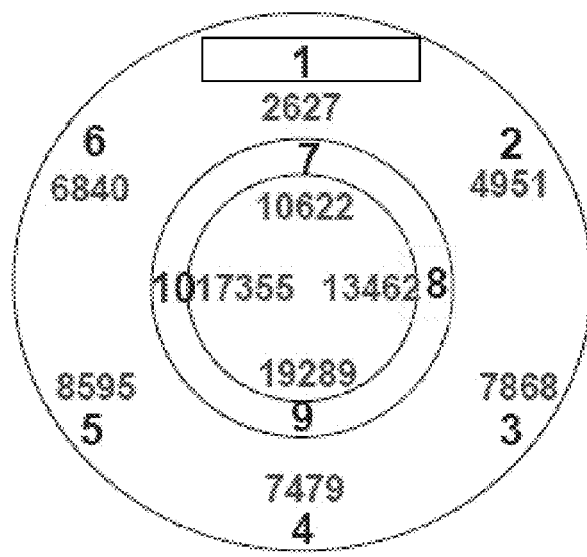
FIGS. 5A and 5B depict test results of clean processes performed according to the techniques of the present invention and prior art, respectively.
Figure 5B:
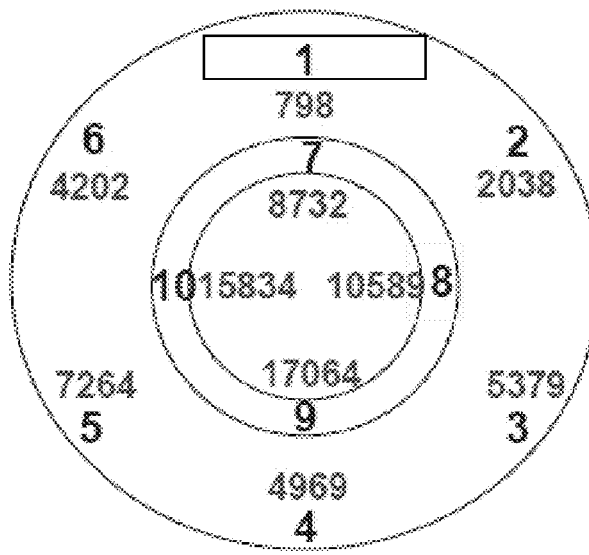

Further evidence of the benefits of the present invention is shown in a comparison of FIG. 5A to FIG. 5B, which represent clean rate at various chamber locations. Specifically, to generate the data in FIGS. 5A and 5B ten separate silicon oxide coupons were placed in a substrate processing chamber at positions noted in the figures (position 1 is near the chamber slit valve) subject to a clean process according to the techniques of the present invention (FIG. 5A) similar to that of FIG. 2A and to a previously known clean process (FIG. 5B) similar to that of FIG. 2B for identical time periods. The thickness of the silicon oxide coupons was then measured after the completion of each clean process to determine how much silicon oxide was removed from the coupons at the various chamber locations where the actual removed amount is shown in FIGS. 5A and 5B. A comparison of the amount of material removed at the same locations in FIGS. 5A and 5B indicates that, at each of the chamber locations, the clean rates associated with FIG. 5A are greater than the clean rates associated with corresponding locations of the chamber depicted in FIG. 5B.

Embodiments of the present invention can be implemented using a variety of substrate processing chambers providing the chambers have the capability of transporting remotely dissociated reactive species into the chamber from a remote plasma source in fluid communication with the chamber. Additionally, if optional step 6 (FIG. 1) is employed the chambers need to have the capability of creating reactive etch species within the chamber by forming an etchant plasma within the chamber (an in situ plasma). An example of an inductively-coupled HDP-CVD chamber in which some embodiments of the method of the present invention can be practiced is set forth below. It is to be understood that the following chamber description is for exemplary purposes only as the techniques of the present invention can be used in a variety of other deposition chambers including thermal CVD chambers and other plasma chambers including PECVD chambers and ECR-HDP chambers among others.

Figure 6:
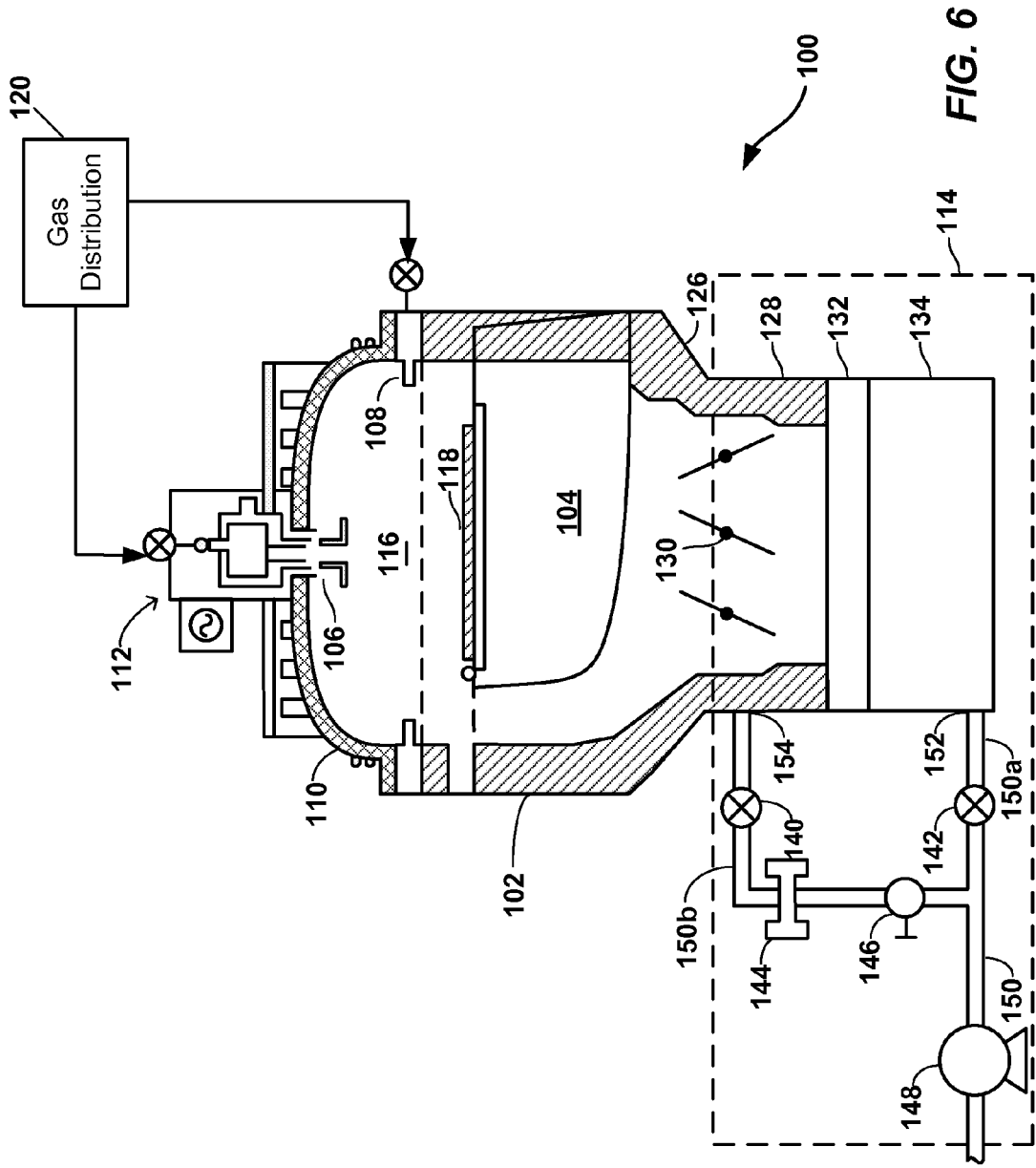
FIG. 6 is a simplified, cross-sectional view of an exemplary substrate processing system with which embodiments of the present invention may be used.

FIG. 6 is a simplified cross-sectional view of a high density plasma chemical vapor deposition (HDP-CVD) system 100 in which the chamber cleaning techniques according to the present invention can be employed. CVD system 100 includes, among other elements, a chamber body 102, a substrate support 104 (e.g., an electrostatic chuck), gas nozzles 106, 108, a chamber dome 110, a remote plasma cleaning system 112 and a vacuum system 114. Chamber body 102, dome 110 and substrate support 104 combine to define a processing region 116 in which a substrate 118 is positioned during a substrate processing operation, such as a chemical vapor deposition operation. For convenience, numerous features of system 100 that are not directly relevant to the invention have been omitted from FIG. 6 and are not discussed herein. For example, system 100 includes a gas distribution system 120 that delivers process gases to gas nozzles 106, 108, as well as source and bias plasma systems (not shown) that are coupled to the chamber to provide energy to form a plasma within the chamber from the process gases introduced into the chamber.

Vacuum system 114 includes a body member 126 that forms a lower portion of chamber 102 and joins the chamber to the vacuum system, and a throttle body 128, which houses a three-blade throttle valve 130 and is attached to a gate valve 132 and a turbo-molecular pump 134, which allow accurate and stable control of chamber pressures as low as about 1 mTorr during substrate processing operations. Gate valve 132 can isolate pump 134 from the throttle body 128 and process region 116.

Vacuum system 114 also includes additional isolation valves 140 and 142, an endpoint detector 144, an additional throttle valve 146 and a roughing pump 148. During substrate processing operations, isolation valve 140 is closed while gate valve 132 and isolation valve 142 are open. Gases are exhausted into a foreline 150 through port 152 and gas conduit 150a. Pressure during substrate processing operations is controlled by throttle valve 130. During a chamber clean operation, gate valve 132 and isolation valve 142 are closed while valve 140 is open. The cleaning gas is exhausted into foreline 150 through port 154 and gas conduit 150b. Pressure during the chamber cleaning operation is controlled by throttle valve 146. Gas conduits 150a and 150b are part of gas foreline 150.

Chamber body 102, body member 126 and throttle body 128 are welded together to form an integral housing. Port 154 is one of three ports that are located at about the same height on chamber 100. The other two ports are located 90 degrees to the left and right of port 154 and are thus not shown in FIG. 6. Each of the aforementioned three ports are upstream (with respect to gas flow into and out of the chamber during substrate processing and chamber clean operations) from gate valve 132 and turbo molecular pump 134. In some embodiments of the invention, the ports not shown are typically used to couple devices such as a pressure gauge or purge of helium gas to chamber 100. In embodiments where increased pumping capacity is utilized, however, however, these additional ports are coupled directly to the foreline with appropriate fittings and valves to provide gas flow paths to the foreline in addition to the path through port 154 during a chamber cleaning operation and thereby increase the pumping capacity of chamber 100 during a chamber cleaning operation. Further details of such a foreline arrangement are discussed in U.S. application Ser. No. 12/265,641 published on May 14, 2009 as U.S. Publication No. 2009/0120464, which is incorporated herein by reference.

Having fully described several embodiments of the present invention, many other equivalents or alternative embodiments of the present invention will be apparent to those skilled in the art. For example, while the invention was described with respect to cleaning CVD chambers it may also be used to clean other types of chambers, including etch chambers, where appropriate. Also, why the examples set forth above all used $NF_3$ as the etchant gases other etchant gases may be used in other embodiments. As such, the above description is illustrative and not restrictive. These equivalents and/or alternatives are intended to be included within the scope of the present invention.

What is claimed is:

1. A process for removing unwanted deposition build-up from one or more interior surfaces of a substrate processing chamber after processing a substrate disposed in the substrate processing chamber, the process comprising:
    transferring the substrate out of the substrate processing chamber;
    removing the unwanted deposition build-up by:
    (a) flowing a fluorine-containing etchant gas into a remote plasma source fluidly coupled to the substrate processing chamber, forming reactive species from the fluorine-containing etchant gas and transporting the reactive species into the substrate processing chamber; and
    (b) cycling pressure within the substrate processing chamber between a high pressure within a first range and a low pressure within a second range for at least two cycles of both high pressure and low pressure while continuously flowing the fluorine-containing etchant gas into the remote plasma source and continuously transporting the reactive species into the substrate processing chamber, wherein the high pressure is higher than the low pressure, a flow rate of the fluorine-containing etchant gas into the remote plasma source is 3000 sccms or more during the high pressure cycles and a duration of the low pressure cycles is between 4-8 seconds.

2. The process set forth in claim 1 wherein the high pressure is less than 15 Torr and the low pressure is 50 percent or less than the high pressure.

3. The process set forth in claim 1 wherein the high pressure is between 4-15 Torr and the low pressure is between 0.5-4 Torr.

4. The process set forth in claim 1 wherein the high pressure is between 5-8 Torr and the low pressure is between 0.5-2.5 Torr.

5. The process set forth in claim 1 wherein the fluorine-containing etchant gas comprises nitrogen trifluoride.

6. The process set forth in claim 1 wherein a duration of each low pressure cycle is between 10-33 percent of the duration of the preceding high pressure cycle.

7. The process set forth in claim 1 further comprising heating the substrate processing chamber with an in situ plasma formed from an inert gas prior to flowing the fluorine-containing etchant gas into the remote plasma source.

8. The process set forth in claim 1 wherein the high and low pressure cycles are cycled at least four times during the process.

9. The process set forth in claim 1 further comprising, after step (b), reducing the flow rate of the fluorine-containing etchant gas.

10. The process set forth in claim 2 wherein a flow rate of the fluorine-containing etchant gas into the remote plasma source is at least 4 liters per minute when pressure within the substrate processing chamber is within the first range during the high pressure cycles.

11. The process set forth in claim 9 wherein the fluorine-containing etchant gas comprises nitrogen trifluoride.

12. A process for removing unwanted deposition build-up from one or more interior surfaces of a substrate processing chamber after processing a substrate disposed in the substrate processing chamber, the process comprising:
    transferring the substrate out of the substrate processing chamber;
    removing the unwanted deposition build-up by:
    (a) flowing a fluorine-containing etchant gas into a remote plasma source fluidly coupled to the substrate processing chamber and forming reactive species from the fluorine-containing etchant gas;
    (b) maintaining a continuous flow of the reactive species from the remote plasma source to the substrate processing chamber while repeating a plurality of times a cycle of:
    (i) a high pressure clean step in which the reactive species are flown into the substrate processing chamber while pressure within the substrate processing chamber is maintained between 4-15 Torr, and
    (ii) a low pressure clean step in which the reactive species are flown into the substrate processing chamber while reducing the pressure of the substrate processing chamber by at least 50 percent of a high pressure reached in the high pressure clean step, wherein a flow rate of the fluorine-containing etchant gas into the remote plasma source is 3000 sccms or more during the high pressure clean steps and a duration of the low pressure clean steps is between 4-8 seconds.

13. The process set forth in claim 12 wherein the high pressure is between 5-8 Torr and the low pressure is between 0.5-2.5 Torr.

14. The process set forth in claim 12 wherein a flow rate of the fluorine-containing etchant gas into the remote plasma source is at least 4 liters per minute when pressure within the substrate processing chamber is maintained between 4-15 Torr during the high pressure clean step.

15. The process set forth in claim 12 wherein the fluorine-containing etchant gas comprises nitrogen triflouride.

16. The process set forth in claim 12 wherein the high and low pressure steps are cycled at least four times during the process.

17. The process set forth in claim 12 wherein the low pressure clean step has a duration of between 10-33 percent of that of the high pressure clean step.

18. The process set forth in claim 12 further comprising, after step (b)(ii), reducing the flow rate of the fluorine-containing etchant gas.

19. The process set forth in claim 18 wherein the fluorine-containing etchant gas comprises nitrogen trifluoride.

* * * * *

UNITED STATES PATENT AND TRADEMARK OFFICE
CERTIFICATE OF CORRECTION

| | | |
|---|---|---|
| PATENT NO. | : 7,967,913 B2 | Page 1 of 1 |
| APPLICATION NO. | : 12/508381 | |
| DATED | : June 28, 2011 | |
| INVENTOR(S) | : Zhong Qiang Hua et al. | |

It is certified that error appears in the above-identified patent and that said Letters Patent is hereby corrected as shown below:

Title Page:

(75) (Inventor's name), please delete "Hien-Minh Huu Le" and insert --Hien Minh Le--.

Signed and Sealed this
Twenty-ninth Day of April, 2014

Michelle K. Lee
*Deputy Director of the United States Patent and Trademark Office*